United States Patent [19]
Liu et al.

[11] Patent Number: 5,327,373
[45] Date of Patent: Jul. 5, 1994

[54] OPTOELECTRONIC MEMORIES WITH PHOTOCONDUCTIVE THIN FILMS

[75] Inventors: Chongyang Liu, Austin, Tex.;
Horng-long Pan, Taipei, Taiwan;
Allen J. Bard; Marye A. Fox, both of Austin, Tex.

[73] Assignee: Board of Regents, The University of Texas System, Austin, Tex.

[21] Appl. No.: 933,452

[22] Filed: Aug. 21, 1992

[51] Int. Cl.$^5$ .............................................. G11C 11/42
[52] U.S. Cl. ................................... 365/112; 365/110; 365/109; 365/113; 365/119
[58] Field of Search ............... 365/112, 110, 109, 113, 365/119, 151

[56] References Cited

U.S. PATENT DOCUMENTS

| | | |
|---|---|---|
| 2,912,592 | 11/1959 | Mayer . |
| 3,005,707 | 10/1961 | Kallmann et al. . |
| 3,059,115 | 10/1962 | Lempicki . |
| 3,158,842 | 11/1964 | Anderson . |
| 3,199,086 | 8/1965 | Kallmann et al. . |
| 3,268,331 | 8/1966 | Harper . |
| 3,396,235 | 8/1968 | Button et al. . |
| 3,445,324 | 5/1969 | Fulenwider . |
| 3,543,248 | 11/1970 | Oliver . |
| 3,643,014 | 2/1972 | Rosenberg et al. . |
| 4,124,268 | 11/1978 | Micheron et al. . |
| 4,158,890 | 6/1979 | Burland . |
| 4,381,978 | 5/1983 | Gratzel et al. . |
| 4,459,682 | 7/1984 | Mossberg . |
| 4,571,029 | 2/1986 | Skotheim et al. . |
| 4,627,029 | 12/1986 | Wilson et al. . |
| 4,670,860 | 6/1987 | Wilson . |
| 4,672,265 | 6/1987 | Eguchi et al. . |
| 4,720,432 | 1/1988 | VanSlyke et al. . |
| 4,741,976 | 5/1988 | Eguchi et al. . |
| 4,769,292 | 9/1988 | Tang et al. . |
| 4,775,820 | 10/1988 | Eguchi et al. . |
| 4,804,930 | 2/1989 | Simic-Glavaski . |
| 4,812,352 | 3/1989 | Debe . |
| 4,819,210 | 4/1989 | Miura et al. . |
| 4,855,951 | 8/1989 | Tomioka et al. . |
| 4,871,236 | 10/1989 | Gemma et al. . |
| 4,882,428 | 11/1989 | Irie . |
| 4,929,524 | 5/1990 | Sakai et al. . |
| 4,935,756 | 6/1990 | Hotomi et al. . |
| 4,937,119 | 6/1990 | Nikles et al. . |
| 4,940,854 | 7/1990 | Debe . |
| 4,950,579 | 8/1990 | Debe et al. . |
| 4,962,479 | 10/1990 | Imai et al. . |
| 4,966,798 | 10/1990 | Brosius et al. . |
| 4,977,064 | 12/1990 | Sukawa et al. . |
| 4,982,362 | 1/1991 | Comberg et al. . |
| 4,987,023 | 1/1991 | Sato et al. . |
| 5,010,451 | 4/1991 | Ueyama et al. . |
| 5,010,517 | 4/1991 | Migita et al. . |
| 5,011,756 | 4/1991 | Nikles . |
| 5,015,748 | 5/1991 | Eida et al. . |
| 5,016,063 | 5/1991 | Beratan et al. . |
| 5,032,973 | 7/1991 | Yoshimura . |
| 5,035,835 | 7/1991 | Asakawa et al. . |
| 5,038,321 | 8/1991 | Van Zeghbroeck . |
| 5,039,561 | 8/1991 | Debe . |
| 5,041,582 | 8/1991 | Eida et al. . |
| 5,045,440 | 9/1991 | Onorato et al. . |

(List continued on next page.)

OTHER PUBLICATIONS

Search Report (PCT/US93/07821), dated Nov. 8, 1993.
Gregg, B. A. et al., "Porphyrin Octaesters: New Discotic Liquid Crystals," *J. Chem. Soc., Chem. Commun.*, 1143 (1987).

(List continued on next page.)

*Primary Examiner*—Eugene R. LaRoche
*Assistant Examiner*—Huan Hoang
*Attorney, Agent, or Firm*—Arnold, White & Durkee

[57] ABSTRACT

Methods and apparatii are described for information storage in photoconductive film of single layer composition by irradiation of memory elements simultaneously with application of an electric field. Information is stored as trapped charge accumulations in the film when the irradiation is removed, but trapped charge can be released by subsequent irradiation. Repeated information storage, followed by erasure, returns the films to their original state without degradation.

18 Claims, 16 Drawing Sheets

U.S. PATENT DOCUMENTS

| | | |
|---|---|---|
| 5,047,687 | 9/1991 | VanSlyke . |
| 5,059,510 | 10/1991 | Jones, Jr. et al. . |
| 5,059,861 | 10/1991 | Littman et al. . |
| 5,062,693 | 11/1991 | Beratan et al. . |
| 5,063,417 | 11/1991 | Hopfield . |
| 5,066,564 | 11/1991 | Zertani et al. . |
| 5,128,893 | 7/1992 | Takanashi et al. . |
| 5,179,533 | 1/1993 | Bullington et al. ............... 365/109 |
| 5,182,724 | 1/1993 | Yanagisawa et al. ............ 365/151 |

OTHER PUBLICATIONS

Gregg, B. A. et al., "2,3,7,8,12,13,17,18-Octakis (β-hydroxyethyl)porphyrin (Octaethanolporphyrin) and Its Liquid Crystalline Derivatives: Synthesis and Characterization," *J. Am. Chem. Soc.*, 11:3024–3029 (1989).

Gregg, B. A. et al., "Effects of Order on the Photophysical Properties of the Liquid Crystal Zinc Octakis (β-octoxyethyl) porphyrin," *J. Phys. Chem.*, 93:4227–4234 (1989).

Gregg, B. A. et al., "Photovoltaic Effect in Symmetrical Cells of a Liquid Crystal Phorphyrin," *J. Phys. Chem.*, 94(4):1586–1598 (1990).

Liu, C-Y and Bard, A. J., "Irradiation–induced Nanometer-Scale Surface Etching of a CdSe Film with a Scanning Tunneling Microscope," *Chem. Phys. Lett.*, 174(2):162–166 (1990).

Yatsuda Y., et al., "Hi-MNOS II Technology for a 64-kbit Byte-Erasable 5-V-Only EEPROM," *IEEE Trans. on Elec. Dev.*, ED-32(2):224–231 (1985).

Freeman, J. R. et al., "Persistent Internal Polarization," *Rev. of Mod. Phys.*, 33(4):553–573 (1961).

Bradley A. C., "Rewritable Disks," *Optical Storage for Computers*, Chpt. 3, pp. 55–62, Wiley, New York, (1989).

Prince B., Due-Gundersen G., "The First Memory Decade," Chpt. 2, pp. 8–25, *Semiconductor Memories*, Wiley, New York (1983).

Kallmann H. and Rosenberg B., "Persistent Internal Polarization," *Physical Review*, 97:6, 1596–1610, New York, (1955).

M=Zn
R=C₁₀H₂₁ ns ted.[15] Recording or erasing cycles involving such heat-

OPTOELECTRONIC MEMORIES WITH PHOTOCONDUCTIVE THIN FILMS

DEFINITIONS

α film absorption coefficient at the wavelength of the writing or reading beam
ITO indium-tin oxide transparent conductive layer
ms $10^{-3}$ second
μm $10^{-6}$ meter
ns $10^{-9}$ second
PIP persistent internal polarization
STM scanning tunneling microscope
V volt
W/R write/read
ZnODEP zinc-octakis (β-decoxyethyl) porphyrin
Ω electrical resistance (ohms)

BACKGROUND OF THE INVENTION

1. Field of the Invention

The invention relates to methods and apparatii for optoelectronic digital memories (combining optic and electric ports). More particularly, compositions and fabrication methods using photoconductive thin films for high-density, high-speed storage of digital data are included within the claimed invention.

2. Photosensitive Memories

Photosensitive organic compounds in multilayer configurations have been proposed and used for information storage,[7] especially for images. Photovoltaic behavior of single-layer organic films (liquid crystal porphyrins in particular) has also been described recently.[4] Storage of binary data as trapped charge is taught in a recent U.S. Patent for silicon nitride layers on silicon substrates,[11] and information storage in materials with persistent internal polarization (PIP)[14] is described in references dealing with photocopying[8] and computers.[9] Photoelectrets (photoconductors with capacity for PIP in the dark) are taught as memory elements in several U.S. Patents.[10, 12, 13] However, recent technical references[15, 16] reveal no use of the thin film memory elements of the present invention in high-density, high-speed, optoelectronic digital memories with a capability for long-term information storage.

On the contrary, instead of being in the form of thin film memory elements, photosensitive memory media in prior art devices are generally so thick (80–650 μm)[14] that light penetrates less than 1% of the thickness. Consequently, prior art devices use light to aid in manipulation of surface electrostatic charge, but specific charge distributions can only be maintained for a few hours in the dark. In fact, charge distributions established under photoexcitation can be altered long after the light has been extinguished (as much as a day later).[8] Thus, long-term information storage with such films is not possible.

Additionally, prior art memory media are multi-component systems comprising photoconductive particles dispersed in insulating binder matrices, the matrix in each case being non-photoconductive.[8, 9, 10, 13, 14, 18, 19, 20] Because of the substantial memory film thickness, prior art devices require relatively high voltage for their operation (ca 300 V) and have relatively slow response times (from about a ms to a fraction of a μs). A voltage applied across a thick film of prior art memory medium creates an electric dipole at each electrode contact; the two dipoles can then be detected and separately discharged.[8] The stored charge in prior art memory media is surface electrostatic charge, so that the surface charge density is not a function of film thickness ad is too small ($10^{-18}$ to $10^{-18}$ coulomb/μm$^2$) to be used in high density memories.[14,20]

Modern Computer Memories

Memories most used in modern digital equipment have little in common with prior art photosensitive information storage. Rather, common computer memories are of five basic semiconductor types: bipolar, charge coupled devices, magnetic bubbles, complementary metal oxide semiconductor, and N-channel metal oxide semiconductor.[16] Two disadvantages common to all five types relative to memories of the present invention are (1) slower speed by at least a factor of ten, and (2) more complex structures with accompanying higher fabrication costs.

Optical storage devices are, of course, available for modern computers, but the recording technology used for rewritable optical disks is basically the same as in write-once-read-many disks. It involves heating the storage element with laser light to effect a change of state in the storage media which is subsequently detected.[15] Recording or erasing cycles involving such heating processes take significantly longer than the few nanoseconds required to write or erase data elements in the present invention.

SUMMARY OF THE INVENTION

The present invention includes methods and appratii for optoelectronic digital memories. Such memories are characterized by thin film storage media (less than 10 μm thick), rapid response times (less than 5 ns), high density charge storage (greater than $10^{-14}$ coulomb/μm$^2$) virtually unlimited information storage times, and low operating voltages (0.5 to 10 V). Because memory media films are so thin in the present invention, light penetrates the entire film thickness, and a voltage applied across the irradiated film results in formation of a single electric dipole across the film and electrodes. The magnitude of the charge density for such a dipole is dependent on film thickness, and it can be maintained by simply removing the radiation (light).

Storage media in the present invention include aromatic compounds, phthalocyanines, organometallic compounds, and metal complexes, including complexes of octaalkylether derivatives of octakis (β-hydroxyethyl) porphyrins[1] (FIG. 1). The latter compounds were developed for possible applications in photovoltaic devices and have shown interesting liquid crystal, optoelectric, and photophysical properties[2-4] especially useful in thin film memory cells. For example, a steady-state photocurrent has been produced in a cell containing a film of the $C_8$-derivative of the above porphyrin (metal=Zn, compound referred to as ZnODEP) contained between two parallel transparent conductive electrodes of indium-tin-oxide (ITO) spaced 1–6 μm apart (FIG. 2).[4]

Investigation of the transient response of such porphyrin cells by flash photolysis has revealed that the simultaneous application of an electric field and a pulse of visible light produces charge trapping in the thin film. The present invention embodies the novelty and benefit of this observation. Preferred embodiments described herein define the characteristics which allow porphyrins as well as other organic and inorganic photoconductors to store information when employed in the manner of the invention. The simplicity of single-layer memory media construction and the variety of available media compounds combine to offer the potential for versatile, low-cost, high-speed, high-density memories which require no refreshing for long-term (more than 6000 hours) memory retention at room temperature. Thus, the various apparatii of the present invention constitute a significant advance over comparable prior-art memory systems, and are likely to replace prior-art devices in many applications.

Experimental Results

To investigate the performance and characteristics of thin film memory elements of the present invention, liftable electrodes with sharp tips (less than 1 μm diameter at the sharp end of the tip) are controlled with a scanning tunneling microscope (STM) type instrument in scanning portions of a thin film photoconductor prepared over an ITO electrode (FIGS. 8c and 8d). Using such apparatus with films of ZnODEP, Sudan 1, Disperse Red 1 and Methyl Red yields memory elements which are localized in the films within less than 1 μm and have response times of less than 2 ns.

Memory Cell Media Characteristics

Memory cell media of the present invention are generally photoconductors in which charge separations within the material are generated in the light and then trapped when the light is removed. Photoconductivity with charge trapping has been observed in (metal)($\beta$-decoxyethyl) porphyrins, where metal=Zn, Cu, Co, Ni and Pd, and in $C_{10}$ derivatives of these compounds. In addition, non-liquid crystal $H_2$ octakis ($\beta$-decoxyethyl) porphyrin also has similar properties, indicating that the liquid crystal property is not essential for charge trapping in the dark. Other classes of photoconductors which demonstrate charge trapping include aromatic compounds, phthalocyanines, organometallic compounds and metal complexes; preferred organic compounds for the present invention include, e.g., Sudan I, Methyl Red, and Disperse Red I.

Media are preferably solid thin films at room temperature and exhibit high photoconductivity but low dark conductivity, viz., less than about $10^{-7}\Omega^{-1}cm^{-1}$ for relatively short term memory applications and less than about $10^{-14}\Omega^{-1}cm^{-1}$ for very long term applications. The latter dark conductivity is exhibited, for example, by the porphyrins. The film thickness for one-side irradiation is preferably less than $1/\alpha$, where $\alpha$ is the absorption coefficient of the material at the wavelength of the writing or reading beam. For two-side irradiation, the film thickness should be less than $2/\alpha$. In the case of porphyrins, the preferred film thickness for single-side irradiation is about 0.3 μm to 3 μm.

Memory elements are preferably operated in a saturation mode, resulting in two or three discrete memory states (1,0 or 1,0,−1). The magnitude of charge trapped is a function of storage variables including time, radiation intensity, radiation energy (wavelength), and electric field intensity (bias voltage); saturation may be insured through adjustment of one or more of these variables. It is also possible to operate in a mode in which a continuously variable amount of charge is stored (gray scale mode).

Retrieval of Stored Information

Retrieving information stored as trapped charge is usually accomplished by one of the following means:

1. High-impedance voltage measurement across each memory element without simultaneous irradiation (in the dark),
2. Current pulse measurement in a low-impedance detector circuit after total release of stored charge by irradiation of a single memory element, and
3. Current measurement during partial release of stored charge (limited by irradiation time and intensity or external circuit impedance).

For serial readouts, means 2 and 3 above are preferably addressed to a single memory element through radiation focused only on that element, with currents measured in conducting (ITO) planes common to a plurality of elements. Illumination of single memory elements may be achieved by scanning a sharply focussed light beam over the surface of a revolving disk (FIG. 8a) or over a stationary memory cell.

Alternatively, memory elements may be addressed by individual conductors, allowing parallel readouts through simultaneous irradiation of a plurality of elements (FIG. 7). Additionally, any memory element may be rewritten by application of radiation of the appropriate energy and intensity, simultaneously with an electric field of the appropriate intensity and polarity.

Erasure of a memory element may be accomplished by incident radiation of appropriate intensity with a zero applied electric field (short circuit) or a field opposite in polarity to that applied when the information was written. Memory elements individually or collectively may be repeatedly written, read, refreshed and erased without degradation of digital data storage capacity or change in operating conditions.

BRIEF DESCRIPTION OF THE DRAWINGS

FIG. 10 Readout voltage as a function of time. The data were stored by a single 10 ns laser pulse under a potential of −1.0 V; Readout voltage as a function of time. The data were stored by a single 10 ns laser pulse under a potential of +1.0 V FIG. 11 Readout voltage as a function of time, demonstrating the nondestructive nature of the readout operation. Data were stored by a low level writing beam (ca. 10 $\mu W/cm^2$) under a bias of +0.5 V.

DESCRIPTION OF THE PREFERRED EMBODIMENTS

Electro-Optical Cell Principles

The present invention relates to new methods and memory devices for optoelectronic digital data storage. Data storage elements of the invention are small regions where charge is trapped in a thin film of solid photoconducting material with high dark resistance. Suitable photoconductors for the film preferably include aromatic compounds, phthalocyanines, organometallic compounds, metal complexes, or a liquid crystal porphyrin. One preferred embodiment comprises two plane parallel ITO electrodes and a layer of zinc-octakis (β-decoxyethyl) porphyrin or other preferred photoconductor between the electrodes. Another preferred embodiment comprises a small-area liftable electrode positioned to scan a solid photoconducting thin film overlying another electrode, the assembly being selectively illuminated adjacent to the electrode tip.

Figure 1:
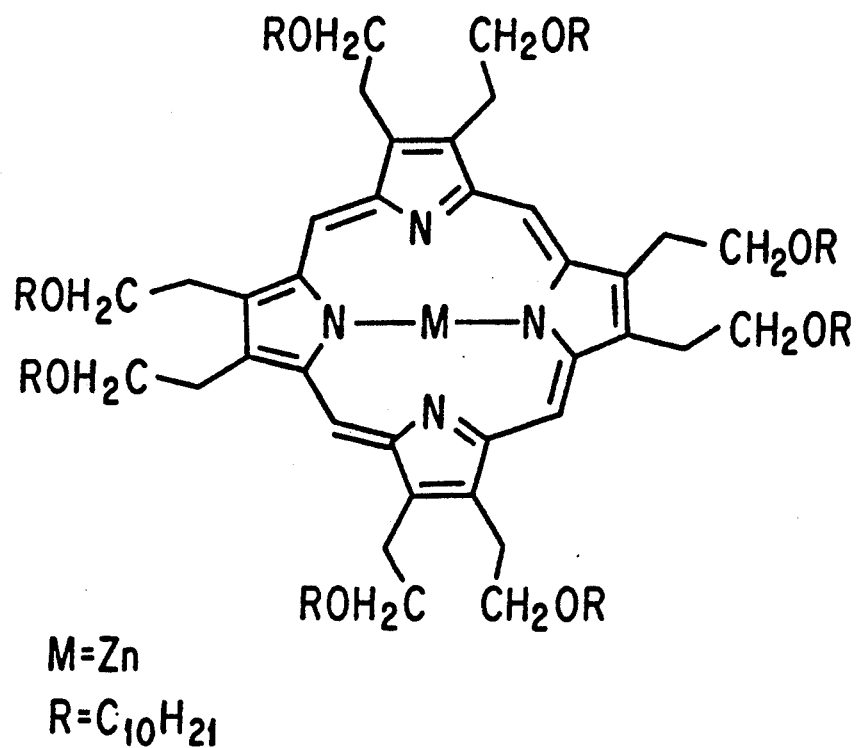
FIG. 1 Zinc-octakis ($\beta$-decoxyethyl) porphyrin (ZnODEP).
Figure 2:
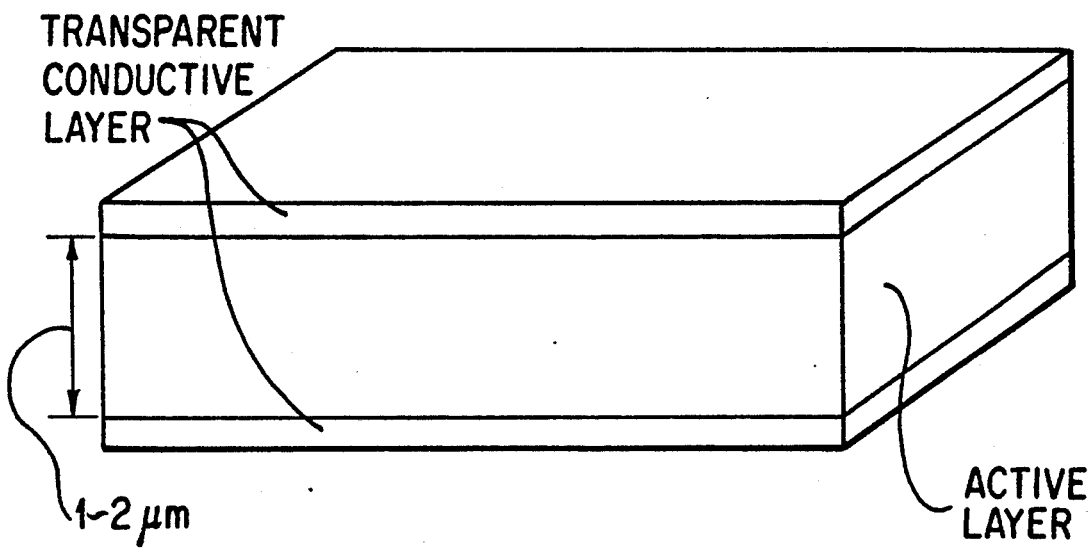
FIG. 2 Schematic diagram of an optical memory device.

FIG. 2 is a diagrammatic representation of one embodiment of the present invention. In this device, the Zn-porphyrin is capillary-filled into a symmetrical cell consisting of two transparent conductive ITO electrodes with an area of about 1 $cm^2$ and a thickness of about 1-2 $\mu m$. Details of cell fabrication are described elsewhere,[4] but for any single layer cell containing a substance with low dark conductivity, the maximum thickness of the recording medium depends mainly on its optical absorption property. Film thickness for single-side irradiation should be less than $1/\alpha$, where e is the absorption coefficient of the medium at the wavelength of the reading and writing beams; for double side irradiation, maximum film thickness is $2/\alpha$. Minimum film thickness, in contrast, depends on the quantity and stability of charge separation desired in the material With porphyrins, a film thickness of about 0.3 $\mu m$ to 3 $\mu m$ is preferred for the present invention, but optimization is necessary to obtain the best sensitivity, stability, and intensity of the readout signal. Factors to be optimized include thickness of the active layer, wavelength and intensity of W/R light beams, magnitude of the applied electric field, and the dark conductivity and photoconductivity of the recording medium. If a liftable electrode is employed to scan a photoconducting film in the manner of a STM, optimized values may be expected to vary from those determined for symmetrical cells and from those determined for cells with only one transparent electrode.

Optical information is written, read, and erased during a radiation pulse (e.g., visible light from a laser or other light source). The mechanism of the memory effect involves photoinduced charge trapping and detrapping processes, with the direction of charge movement controlled by the polarity of the electric field (bias) across the film. The charge stored can be sensed by measuring a memory element's photodischarge current or the voltage which appears across each element because of the charge stored therein. Stored charge appears highly localized, and no leakage of charge is detectable between adjacent memory elements separated by about 0.25 $\mu m$. The minimum times required for either charge storage or erasure (depletion of stored charge) are in the ns range.

Figure 3:
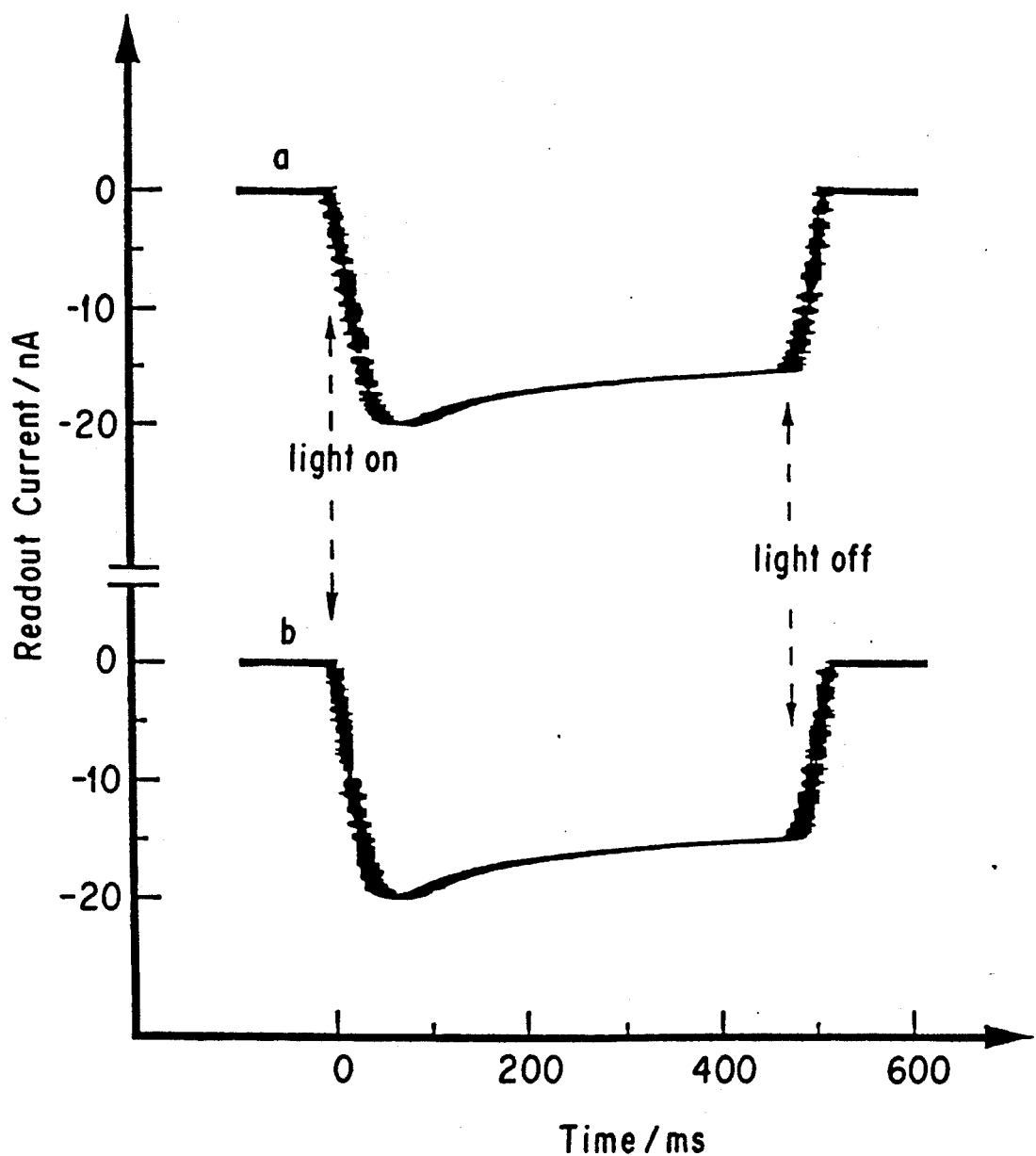
FIG. 3 Initial readout current pulse following writing with 0.5 V bias and 550 nm radiation for 500 ms; Readout current pulse with the same writing conditions as in FIG. 3a after 1.5 billion write/erase cycles (1 ms each).

Besides speed, compactness and nonvolatility, another important advantage of memory devices based on the presently claimed invention is that the charge storage process does not appear to involve any chemical changes or structural transitions. Thus, there are no irreversible changes during extended cycling. FIG. 3 shows a comparison of two readout current pulses obtained after the same writing procedure. The two pulses are essentially the same, although the memory element has been subjected to over 1.5 billion write/read cycles.

Preferred Embodiments

The present invention includes a method for storing digital data as a quantity of electric charge in photoconductive films of single-layer composition, the method comprising applying an electric field substantially perpendicular to a photoconductive film, said film having conductivity less than $10^{-7}\Omega^{-1}cm^{-1}$; irradiating the film within the electric field with electromagnetic radiation; and stopping the radiation. Another method for storing digital data comprises irradiating a photoconductive film of single-layer composition with electromagnetic radiation, said film having conductivity less than $10^{-7}\Omega^{-1}cm^{-1}$; applying an electric field substantially perpendicular to the irradiated film; and stopping the radiation.

Either of the above methods may be modified wherein the electric field is applied between two conductors substantially equidistant from each other and simultaneously in contact with the film, at least one conductor being transparent to the electromagnetic radiation. Further, the electromagnetic radiation may comprise visible light, and the light may have a wavelength about 550 nm.

The photoconductive film in the above examples may comprise (metal) (β-decoxyethyl) porphyrins, wherein the metal is selected from the group Cu, Co, Ni and Pd. The film may also be zinc-octakis (β-decoxyethyl) porphyrin. Other preferred materials for the film include aromatic compounds, phthalocyanines, organometallic compounds, and metal complexes.

The invention also includes apparatus for storing information as a quantity of electric charge in a photoconductive film of single-layer composition, the apparatus comprising a photoconductive film, said film having conductivity less than $10^{-7}\Omega^{-1}\text{cm}^{-1}$; a means to apply an electric field substantially perpendicular to the film; a means to irradiate the film within the electric field with electromagnetic radiation; and a means to stop the radiation. Another embodiment of this apparatus comprises a photoconductive film, said film having conductivity less than $10^{-7}\Omega^{-1}\text{cm}^{-1}$; a means to irradiate a portion of the film with electromagnetic radiation; a means to apply an electric field substantially perpendicular to the film and within the irradiated portion of the film; and a means to stop the radiation.

Also included in the invention are apparatii for storing information as a quantity of electric charge in a photoconductive film, the apparatii comprising a photoconductive film, said film being of single-layer composition; memory elements within said film, each said memory element being capable of storing a detectable quantity of charge, and said memory elements being present at a packing density of at least about $10^7/\text{cm}^2$; a means to apply an electric field perpendicular to each memory element; a means to irradiate each memory element subject to the electric field with electromagnetic radiation; and a means to stop the radiation. Another apparatus for storing information as a quantity of electric charge in a photoconductive film, comprises a photoconductive film, said film being of single-layer composition; memory elements within said film, each said memory element being capable of storing a detectable quantity of charge, and said memory elements being present at a packing density of at least about $10^7/\text{cm}^2$; a means to irradiate each memory element with electromagnetic radiation; a means to apply an electric field substantially perpendicular to each irradiated memory element; and a means to stop the radiation.

In the present invention, means to apply an electric field include placement of conductors on opposite sides of the photoconductive film. The conductors may be continuous or discontinuous, contacting the entire film, contacting a plurality of memory elements comprising less than the total number within the film (as with a strip or bar conductor), or contacting a single memory element. A single memory element can also be addressed if one of the electrical conductors is held close to but not touching the film, as with the scanning tip of a scanning tunneling microscope (STM). An STM is particularly adapted to placement of memory elements in desired patterns and at high packing densities. But in all cases, at least one of the conductors must be transparent to the irradiation applied during data storage, erasure, and reading operations.

Means to irradiate the film in the present invention include both sharply focussed radiation and radiation which falls on a plurality of elements. Sources of radiation preferably include lasers and other sources within the frequency range in which the film is a photoconductor. Duration and intensity of irradiation are preferably adjusted in conjunction with applied electric field intensity to result in saturation of the charge storage capacity of the memory element (when data are being stored) and complete discharge of stored charge (when data are being erased). Data may be read out in a manner in which a major portion of stored charge is temporarily discharged and then replaced, or in a manner in which only a minor portion of stored charge is discharged, which portion is not immediately replaced.

Regardless of the manner of reading, writing and erasing memory elements, exceptionally high packing densities and short write/read times for memory elements are two of the distinguishing features of the present invention. High packing densities imply both very small memory elements and great stability of stored charge, with virtually no leakage of stored charge within a memory element or between adjacent elements. The thin film media which comprises memory elements, as well as accurately focussed electromagnetic radiation and highly localized electric fields found in various embodiments of the invention, aid substantially in achieving desired levels of write/read speed and small memory element size. Additional factors which bear on these parameters are high photoconductivity and low (dark) conductivity of the memory element media.

EXAMPLES

The following examples are presented to describe preferred embodiments and utilities of the present invention, and are not meant to limit the invention unless otherwise stated in the claims appended hereto. Taken together, the examples illustrate representative demonstrations of the best mode of implementing the invention as currently understood.

EXAMPLE 1

Electro-Optical Cell Operation

In the following discussion, the sign of the applied potential will be that of the irradiated (or front) ITO electrode with respect to the back electrode.

Principles of cell operation are illustrated in FIG. 4 with ZnODEP in the role of preferred photoconductor; other preferred thin film media could also be used. Irradiation of the device with a write beam of sufficient energy (550 nm) to excite the ground state of ZnODEP to its first singlet state, gives rise to a cathodic photocurrent when a negative potential is applied to the irradiated ITO with respect to the opposing ITO electrode.

Figure 4A:
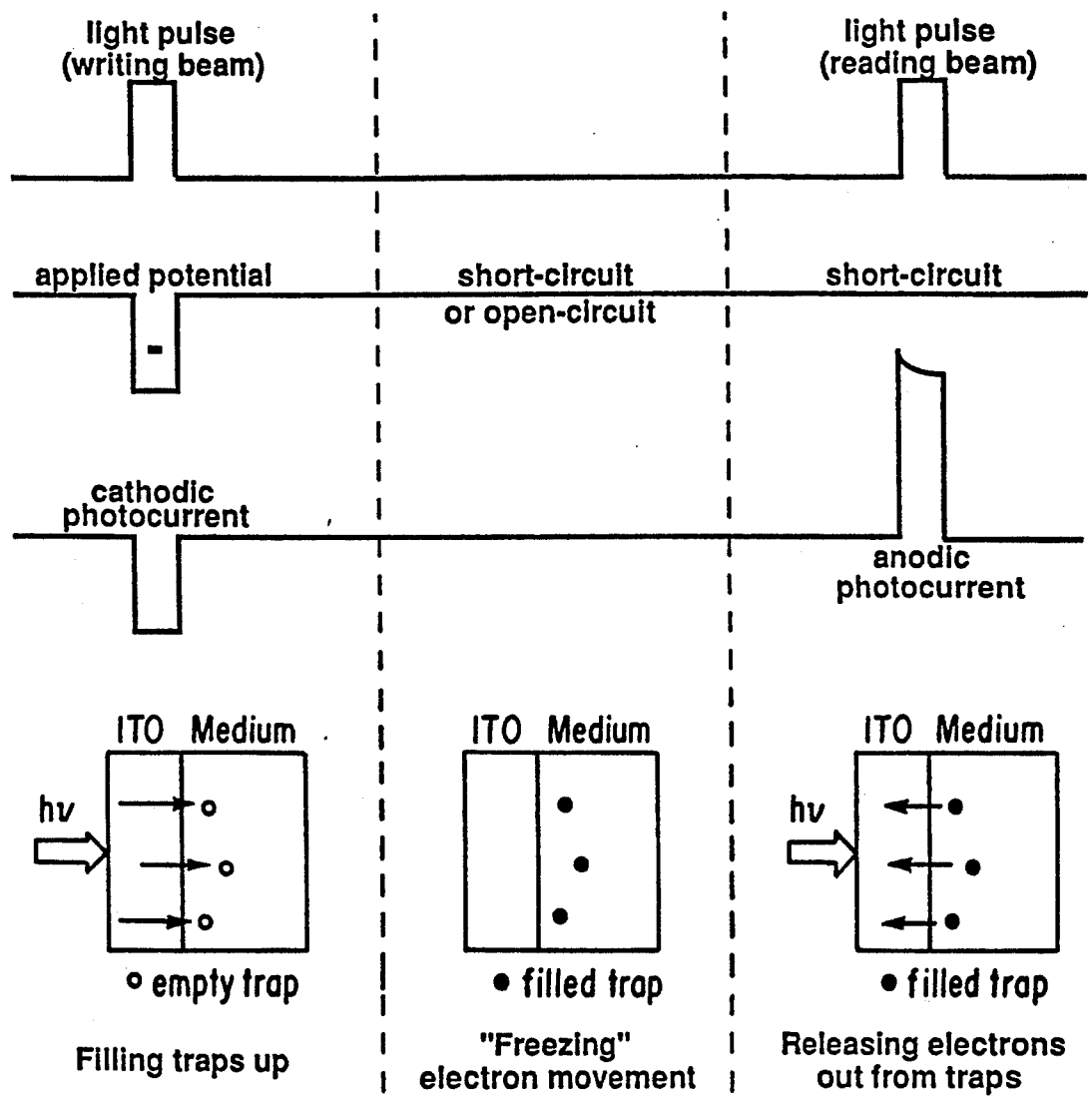
FIG. 4a Under negative bias, the writing beam causes electron storage at trap sites; stored electrons are released by a reading beam under short-circuit conditions.

During the writing, traps in the ZnODEP are filled with electrons (FIG. 4a). These traps have the capacity to store electrons and to release them under appropriate conditions. Note that the resistivity of ZnODEP in the dark is high ($\geq 10^{14}\Omega \cdot \text{cm}$), but it is greatly decreased under irradiation (i.e., ZnODEP is photoconductive). Hence, electron movement can be "frozen" simply by switching off the light. In the dark, charge remains stored under either open-circuit or even short-circuit conditions. Thus, stored information can be read out by irradiation of the device with a read beam (preferably white light containing radiation of 550 nm or shorter wavelength), which causes release of electrons from the traps and leads to an anodic photocurrent spike as shown in FIG. 4a.

An experimentally observed anodic photocurrent spike is shown in FIG. 5a. This spike was obtained by irradiating the above described device with 550 nm light under short-circuit conditions after a writing step (irradiation with 550 nm light for 5 sec with an applied potential of $-2$ V, followed by a dark period of 10 sec at short-circuit).

Figure 4B:
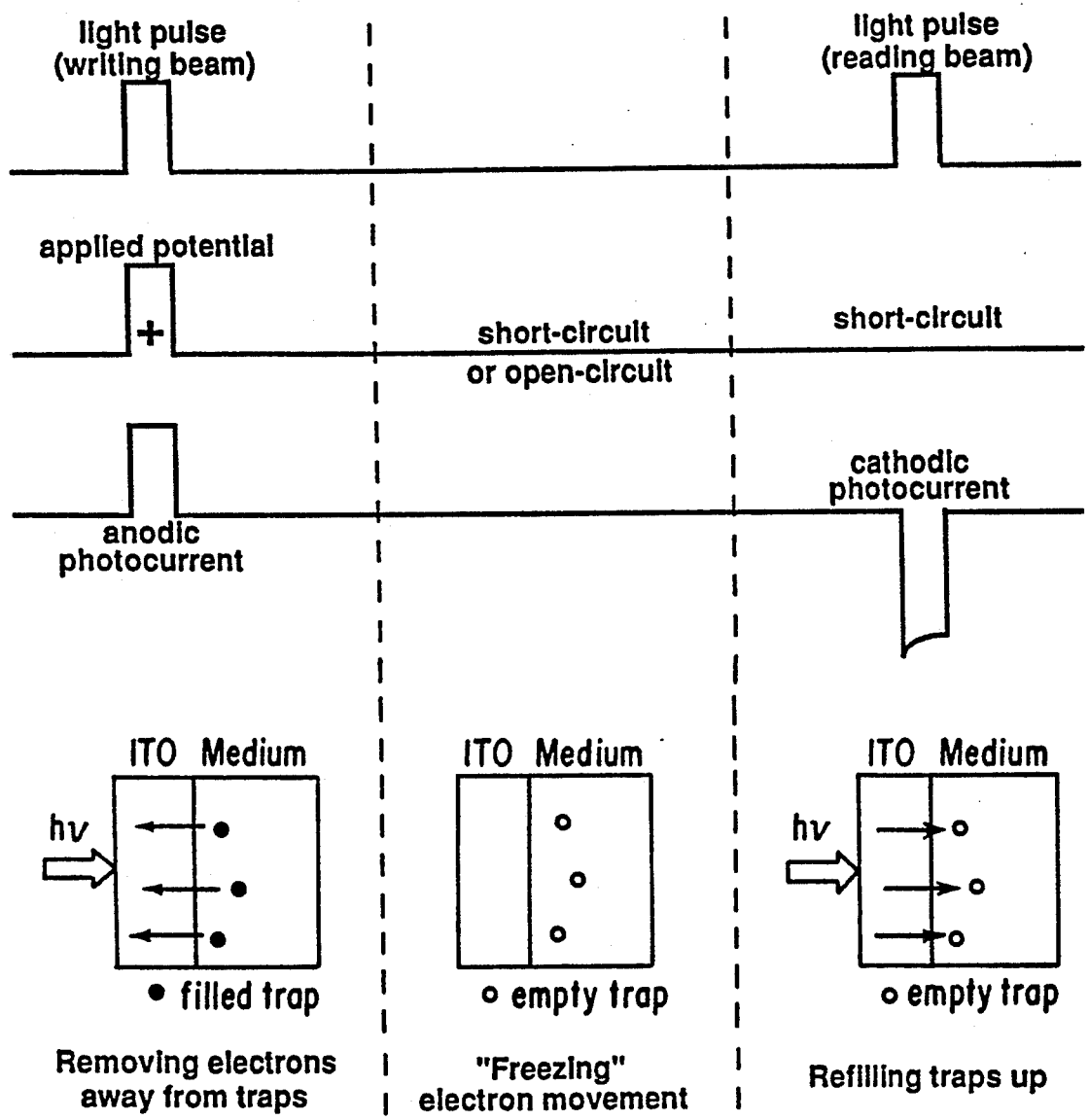
FIG. 4b Under positive bias, the writing beam causes electron removal (hole storage) at trap sites; vacancies are refilled with electrons by a reading beam under short-circuit conditions.

Analogously, one can also create holes by removing electrons from traps by using a write beam while a positive bias voltage is applied, as illustrated in FIG. 4b.

Electrons can then be frozen in the dark; on reading, a cathodic photocurrent spike is generated as a result of trap refilling. Again, the stored information can be released by a read beam without any applied bias voltage present. FIG. 5b shows a typical cathodic photocurrent spike obtained during irradiation (550 nm) of the device without bias voltage after the write step (irradiating the sample at 550 nm for 5 sec under a bias of +2 V, with a dark short circuit period of 10 sec).

Figure 5:
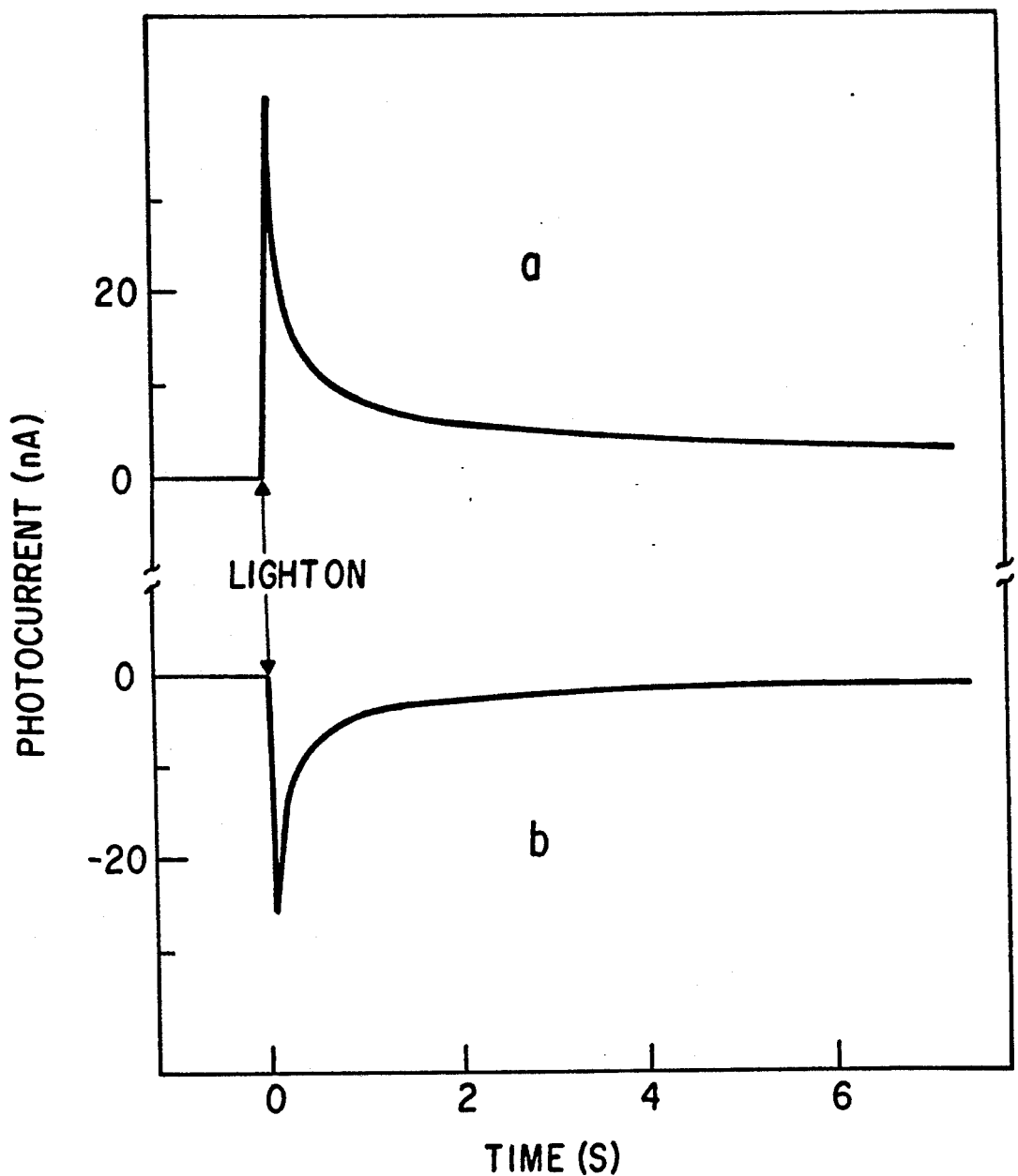
FIG. 5 Accelerated discharge of memory element written by a 550 nm beam with −2 V bias after a 10 sec frozen period under short-circuit; constant irradiation by 550 nm discharge beam under short-circuit conditions; Accelerated discharge of memory element written by a 550 nm beam with +2 V bias after a 10 sec frozen period under short-circuit; constant irradiation by 550 nm discharge beam under short-circuit conditions.

In considering the preferred embodiment described above, either the anodic or cathodic photocurent spikes shown in FIG. 5 can be taken to represent the memory state, , "1", compared to an uncharged, "0", state. Alternatively, this can be the basis of unique three-state device ("0," "1" and "−1"). The magnitude of any read current spike depends on the wavelength, intensity, and pulse width of the write beam and the magnitude of write potential bias. Note that it is not crucial for the light pulse and potential pulse to be precisely synchronized in the write step. In fact, a longer potential pulse does not make any difference in the amount of stored charge because of the high dark resistivity of ZnODEP. Note also that an alternative approach to reading the stored charge is to measure the potential at that location under open circuit (i.e., very high impedance) conditions in the dark.

EXAMPLE 2

Spatial and Temporal Resolution with Optical Addressing

Figure 6:
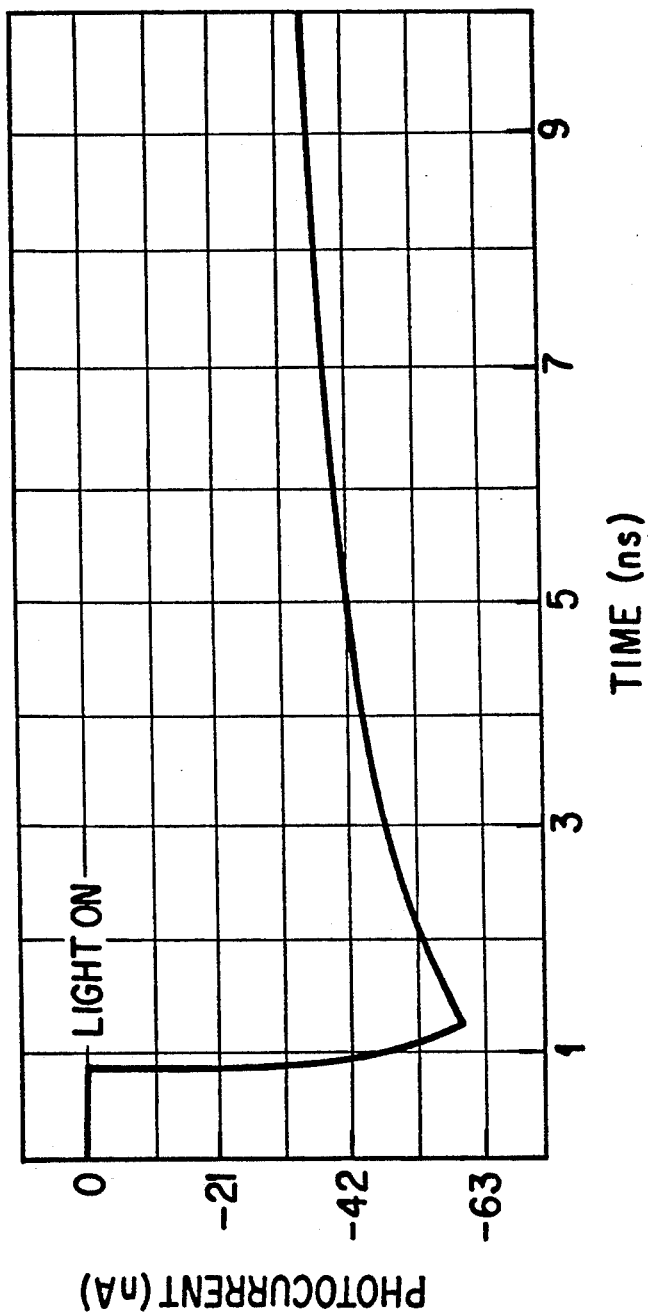
FIG. 6 10 ns laser pulse induced photodischarge current as a function of time.

The spatial resolution of a film of ZnODEP depends upon the lateral resistance (against charge movement) between elements. Resolution is determined either by the size of the optical beam (optical write/read or W/R mode) or by the spatial distribution of the applied bias (electrical W/R mode). In the optical W/R mode, a bias is applied across the whole surface of the ZnODEP and a focused light beam is employed to illuminate spots on the surface. For a laser beam, this focus spot can have a diameter of the order of 1 $\mu$m. The rise time associated with the optical W/R pulses is in the sub-ns range, as shown by the experimental results in FIG. 6, which was obtained with a read beam of a 10 ns laser pulse. Information can be written optically on different sites (memory elements) in the same cell simultaneously or sequentially; elements can then be differentiated quantitatively by the magnitude of current readout (see below).

This is demonstrated by irradiating the front surface of a memory cell (i.e., writing) via a bundle of optical fibers attached to the cell. Data can be stored by irradiation from individual fibers and can be read out individually without interference from charge stored in conjunction with neighboring fibers. Since the charge can be stored for many thousands of hours in a 1 $\mu$m thick cell, no cross-talk is expected between memory elements laterally separated by about 1 $\mu$m (comparable to the thickness of the active layer).

Figure 8A:
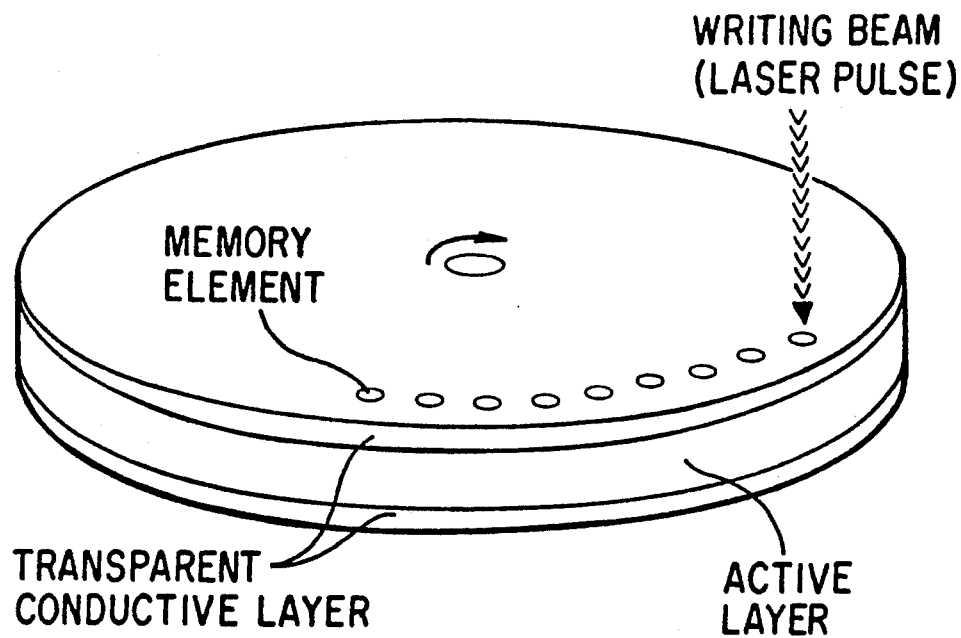
FIG. 8a Schematic representation of a disk-type information storage device with optical W/R mode.

Absence of crosstalk requires a very high dark resistance that prevents leakage of charge through the porphyrin film between the two conductive ITO layers or between charged areas on the surface. Thus, movement of stored charges over a distance of 1 $\mu$m in such highly resistive material is very slow. The density of the memory elements in this mode can therefore be of the order of $10^7/cm^2$. Optimum element packing densities may vary with the preferred embodiment, but each element may be located by use of permanent track and sector markers on rotating disks (FIG. 8a).

EXAMPLE 3

Spatial and Temporal Resolution with Electrical Addressing

Figure 7:
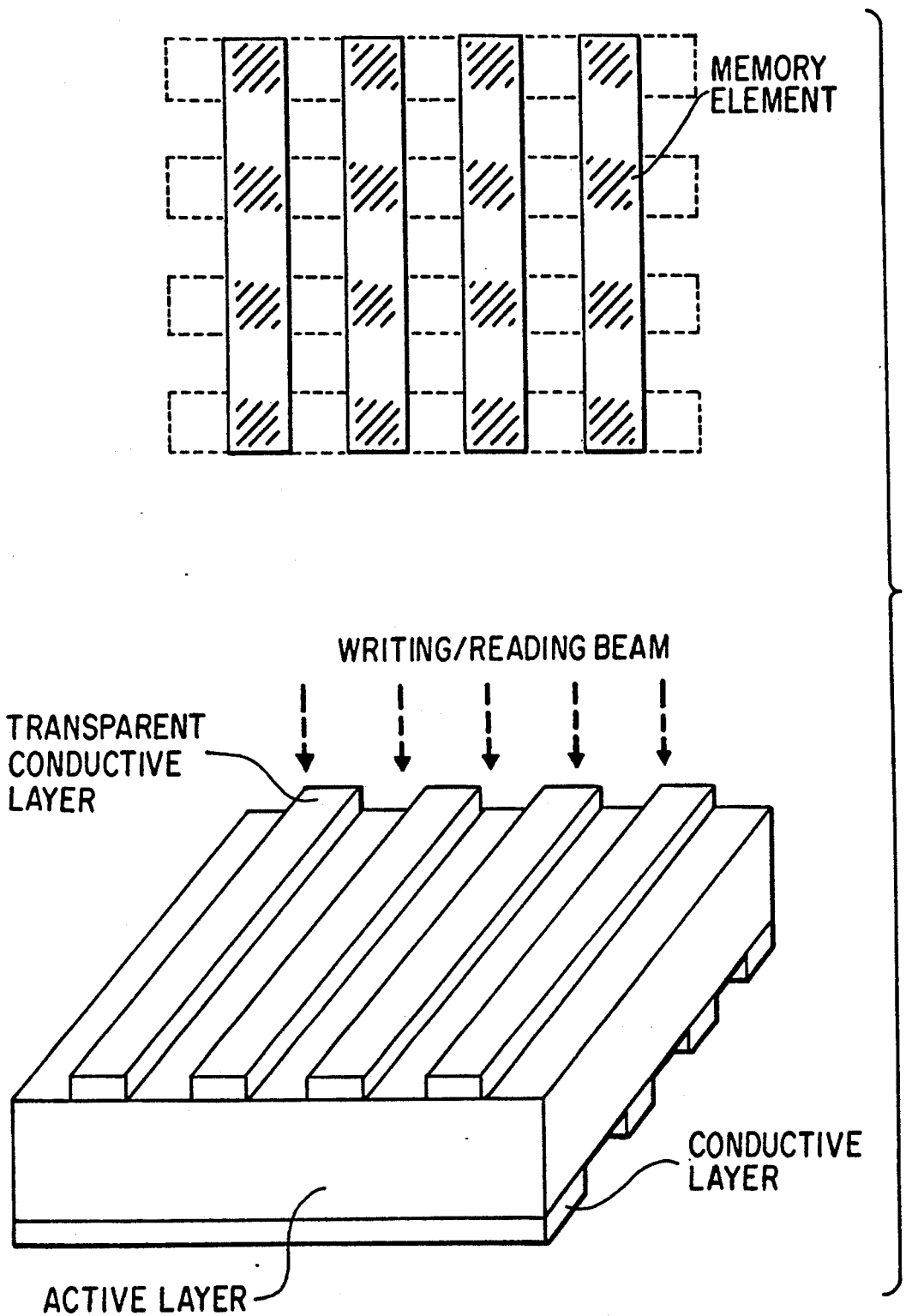
FIG. 7 Schematic representation of apparatus for random access memory.

Electrical addressing of memory elements is accomplished by each element having its own row and column conductors, as in FIG. 7. This matrix array is obtained by having row and column conductors disposed on opposite sides of the photoconductor thin film, the film in local regions of crossovers of the conductors defining bit locations in which digital data are stored by the presence or absence of trapped charge in the film. The general physical arrangement of elements in such an embodiment has been described elsewhere.[17]

EXAMPLE 4

Memory Configurations

Optical and Electrical W/R Modes

A schematic showing three illustrative embodiments of the optical W/R mode is shown in FIG. 8. For example, a laser pulse can be employed as a writing beam with a disk shaped memory as shown in FIG. 8a. The appropriate bias is applied between the two conductive layers during the write and read cycles. As the disk rotates, a photoinduced charge can be stored in each illuminated site (a memory element or pixel). Interelement separation is controlled by adjusting the speed of disk rotation and the width of the laser pulse. This configuration is similar to that used for commercial compact disks except that the writing and reading mechanisms are completely different.

The apparatus shown in FIG. 8 is used for readout as well as for writing. For example, when a reading beam is incident on a memory element, as in FIG. 8a, a photodischarge current will be produced under short-circuit conditions. This is basically the reverse of the writing process, and the photodischarge current, which represents the optical data stored previously, can be easily displayed and processed by conventional electronic techniques. Similar common elements exist in the reading and writing functions of other W/R options as described below.

Figure 8B:
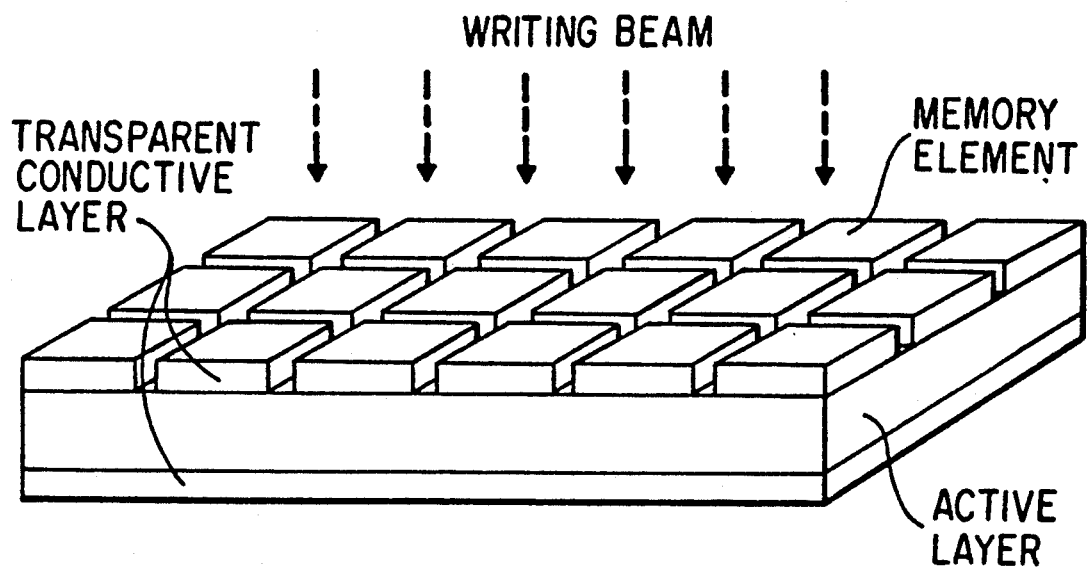
FIG. 8b Schematic representation of a 3×6 array with electrical W/R mode.

FIG. 8b illustrates the electrical W/R mode, in which a continuous light source irradiates a large area and writing is controlled by the local bias voltage. The transparent conductive layer in front of the memory device is divided into many independent units, each of which represents a memory element (or pixel) with dimensions as small as a 2 $\mu$m or less; such element arrays can be fabricated using photolithography.

A programmed sequence of changing external potentials between the front and back conductive layers can be used to store photoinduced charges into each memory element in a controllable manner. Thus, when a closely-spaced, square or rectangular pixel array is exposed to light, individual elements accumulate a quantity of stored charge corresponding to the pattern of incident illumination. The charge stored in each pixel can be made proportional to the product of light intensity and exposure time. As a result, a spatially resolved image can be stored in an electro-optical element array analogous to a charge-coupled device.

Direct Addressing of Memory Elements with Fiber-Optics

Access to individual memory elements is provided by a fiber-optic bundle attached to the front face of a cell. Different individual fibers are irradiated with writing beams of different intensity, while the bias voltage is applied uniformly across all memory elements in the cell. Charges stored simultaneously or serially in different memory elements are read out separately by irradiating individual optical fibers corresponding to the previously written data. The discharge (read cycle) appears as a photocurrent spike, similar to that in FIG. 5, with a magnitude proportional to illumination intensity and exposure time. In general, the product of light intensity and exposure time (total photons) determines the intensity of the readout signal at a constant bias.

Direct Addressing of Memory Elements with an STM

Addressable memory element density may be increased by 1-2 orders of magnitude with a scanning tunneling microscope (STM) as the source of bias voltage for each element. The area affected by the bias voltage with each application of the STM tip defines the size of a memory element. This size may be estimated by using the STM to induce analogous (but irreversible) changes on a photosensitive surface under laser irradiation.[5] In the latter case, the affected spot diameter is controlled by the tip-substrate electric field; it is much smaller than the laser-irradiated area. Since the STM tip is atomically sharp and tunneling current flows through a region only a few Å in diameter, a very small surface modification (<10 nm diameter) is achieved.[5]

Figure 8C:
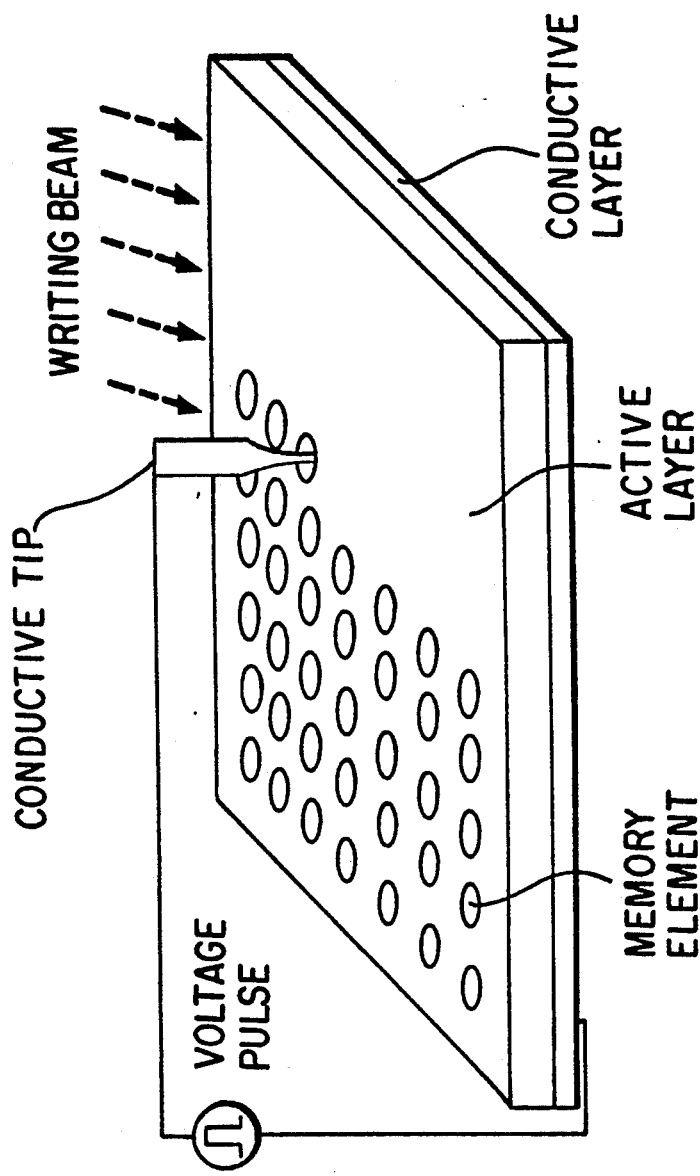
FIG. 8c Schematic representation of a possible process for ultra high-density data storage in the electrical W/R mode with a scanning tunneling microscope.

Application of an STM to electro-optical data storage is illustrated in FIG. 8c. A voltage pulse is applied between the STM tip and the back contact of the active memory layer. A photogenerated charge is then stored under the tip. Since the voltage pulse is programmable while the STM tip is scanning, memory element size is controlled through adjustments of scanning rate and voltage pulse duration. As in the technique described in FIG. 8b, stored information is spatially resolvable with extremely high resolution when read by an STM tip.

Figure 8D:
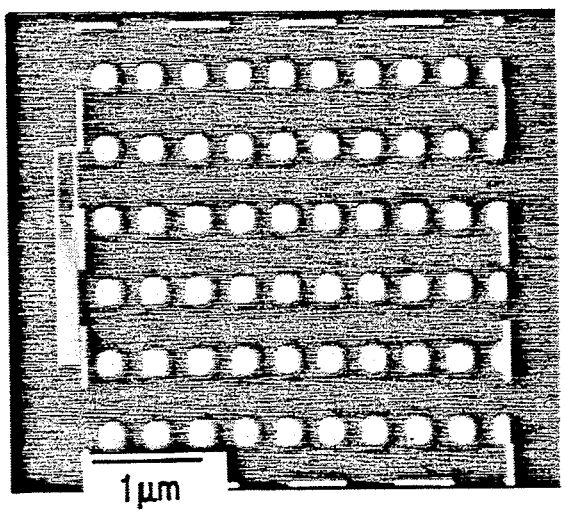
FIG. 8d Discharge current image to demonstrate high-density data storage. Data were written under +10 V bias with STM tip positive and were read out under short-circuit condition with irradiation.

Experimental results are shown in FIG. 8d. Data are written under a bias potential of 10 V between the tip and the back contact of the active layer (Sudan I); readout is under short circuit conditions. Memory elements of 200 nm are obtained, corresponding to element densities of up to $3 \times 10^9 / cm^2$. Use of lower bias potentials would be expected to result in smaller elements with correspondingly higher element densities.

EXAMPLE 5

Readout of Stored Charge

Current Measurements

Charge stored in each memory element is sensed by measuring the photodischarge current under short-circuit conditions; no external bias is necessary. Readout signal magnitude depends on the total amount of charge stored. This depends on the total number of incident photons from the writing beams. But the readout signal also depends on how much bias is applied during writing. This is because each memory element of the electro-optical cell exists in a narrow three-dimensional space similar to that in the double layer capacitance of an electrode in an electrochemical cell. Higher bias voltage results in deeper penetration of the stored charge into the thin film.

Average optical efficiency, viz., the ratio of total amount of charge stored to total number of photons incident on a writing site, is about 0.5%. Since the charge storage mechanism is quite similar to that of a charge-coupled device in which stored charges can remain trapped for many years,[6] the lifetime of data written by this approach is very long. For example, actual measurement shows no loss of stored charge detectable at the picoampere level for a period of eight months under open circuit conditions in the dark.

Multiple Readouts from a Single Memory Element

Obviously, the amount of charge remaining in the traps is reduced after each reading. But by using a sensitive detector, many readings can be made before the traps are depleted. For example, with a 1 nA readout current induced by a 10 ns laser pulse, the amount of charge released would be equivalent to about 60 electrons per reading. In other words over $10^4$ readings at this level can be made from a single stored memory element (10 $\mu m \times 10$ $\mu m$) because the charge stored on a 10 $\mu m \times 10$ $\mu m$ electrode is about $3 \times 10^6$ electrons under a $+1.0$ V bias.

Generally, the reading beam should be weaker than the writing beam to increase the number of readouts obtainable without refreshing the memory element. But since optical data are written under bias and read under short-circuit (zero bias) conditions, memory elements can be read many times, even with a reading beam as intense as the writing beam.

If the same 10 ns laser pulse is used for both writing and reading, stored information can be read many times without refreshing the memory element. As expected, each sequential readout current is slightly smaller than the preceding value, but the difference between adjacent readings decreases as the number of readings increases. After about 1500 readings, the readout signal strength is still above 60% of the first readout current value.

Refreshing Memory Elements

Figure 9:
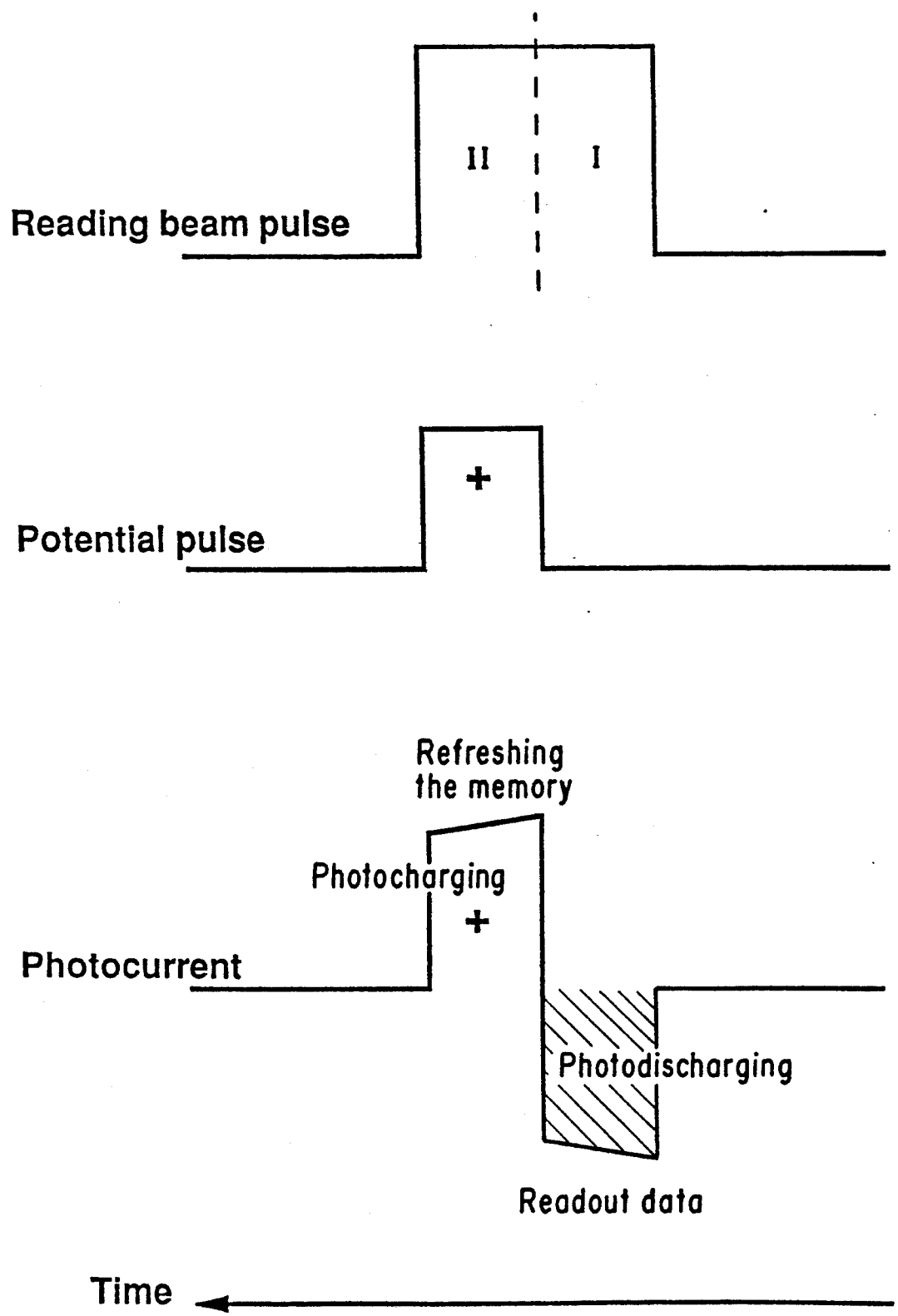
FIG. 9 A method for refreshing a memory element.

Refreshing the information in a memory element is analogous to the operation of conventional dynamic random access memory. For example, a bias pulse of proper width and magnitude is applied to the memory element, coupled with the reading beam pulse as shown in FIG. 9. The first part of the reading beam pulse causes a photodischarge under short circuit conditions, but the second part is applied simultaneously with a bias pulse to recharge the memory element. By this means, the memory element is refreshed immediately after each reading to complete a cycle.

Cycle life (i.e., number of charge/discharge cycles obtainable) is tested by applying continuous bias pulses of 0 V to $+0.5$ V to the cell; pulse duration and pulse interval are both 1 msec, and pulses are applied with constant irradiation. Under these conditions, each memory element may be refreshed at $+0.5$ V immediately following each readout at 0 V in excess of 1.5 billion cycles without degradation.

Voltage Measurements

Figure 10:
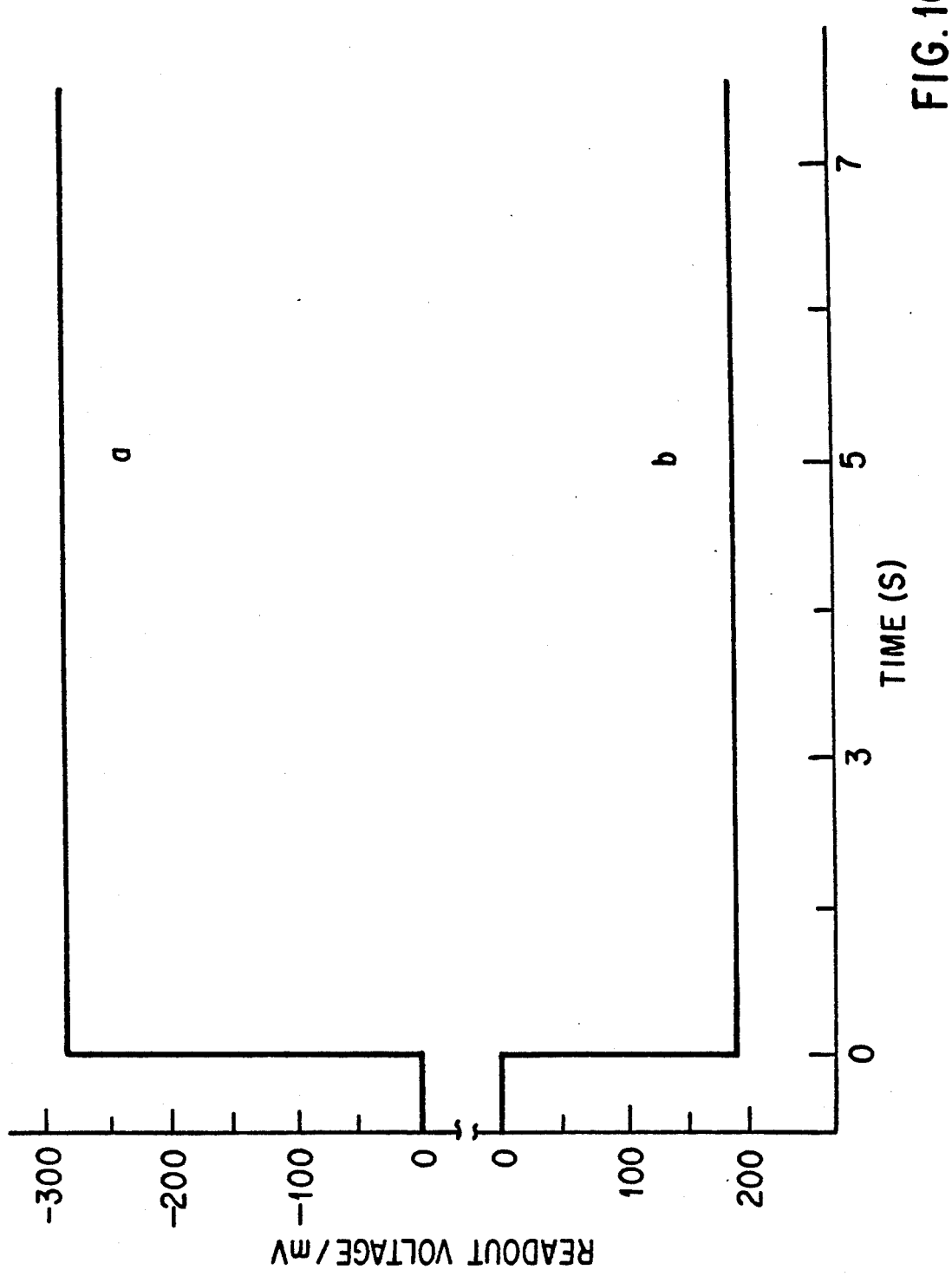

One may read stored information from a memory element in the dark by measuring the voltage produced earlier by photoinduced charge storage. An actual measurement of the readout voltage is shown in FIG. 10; it was obtained after the storage of charge by writing with a single 10 ns laser pulse. Note that a negative voltage is generated with a $-1.0$ V bias during writing (FIG. 10a), and in contrast to FIG. 5, a positive voltage was induced under a $+1.0$ V bias (FIG. 10b). Since virtually no charge flows during voltage measurement, depletion of the signal charge is not a problem in this reading mode. Compared to the transient photocurrent measurement shown in FIG. 5, the readout voltage is essentially constant over time (FIG. 10).

Figure 11:
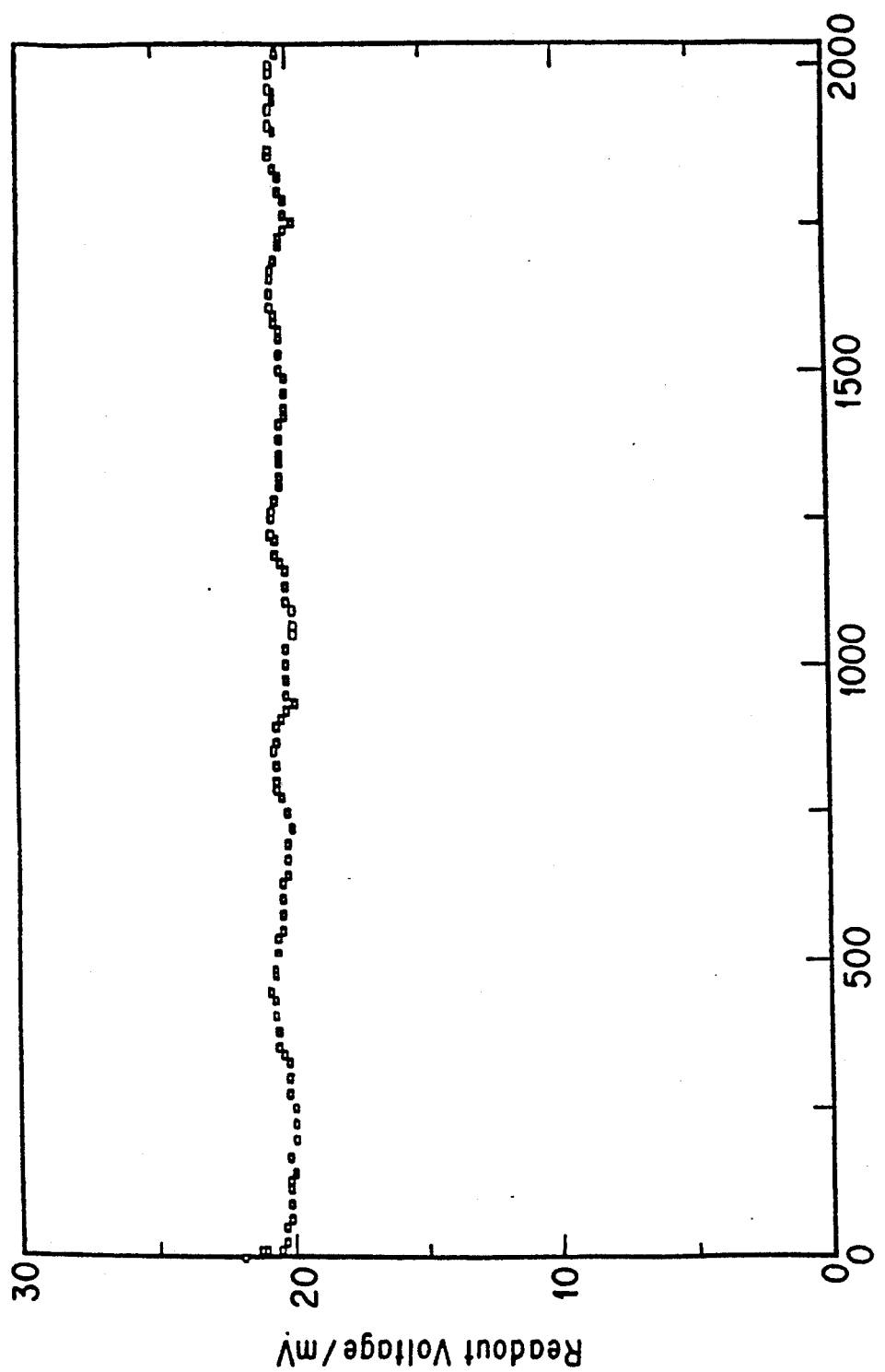

A long-term experiment identifies the extent to which the readout is nondestructive. Charge is generated and stored by a low intensity writing beam (ca. 10 $\mu W/cm^2$) under a small bias ($+0.5$ V), and the stored charge is readout continuously for over 2000 h. The readout voltage is quite constant, with no evidence of decay (FIG. 11). The apparatus shown in FIGS. 8b and 8c can also be used for this voltage readout.

Information Erasure

To purposely erase recorded data, one can simply photodischarge the memory elements. Alternatively, erasing performed under short-circuit conditions requires a relatively long time (ca. 6 sec), as shown in FIG. 5. However, erasure can be considerably accelerated by application of the proper bias to memory elements in conjunction with an erasing beam no stronger than the writing beam. In fact, the same procedure can be used for erasing as for writing, but with the opposite bias potential polarity. In this case, the amount of charge stored during writing is discharged within about the same time as required for the original writing.

EXAMPLE 6

Bias Effects on the Readout Signal

Figure 12:
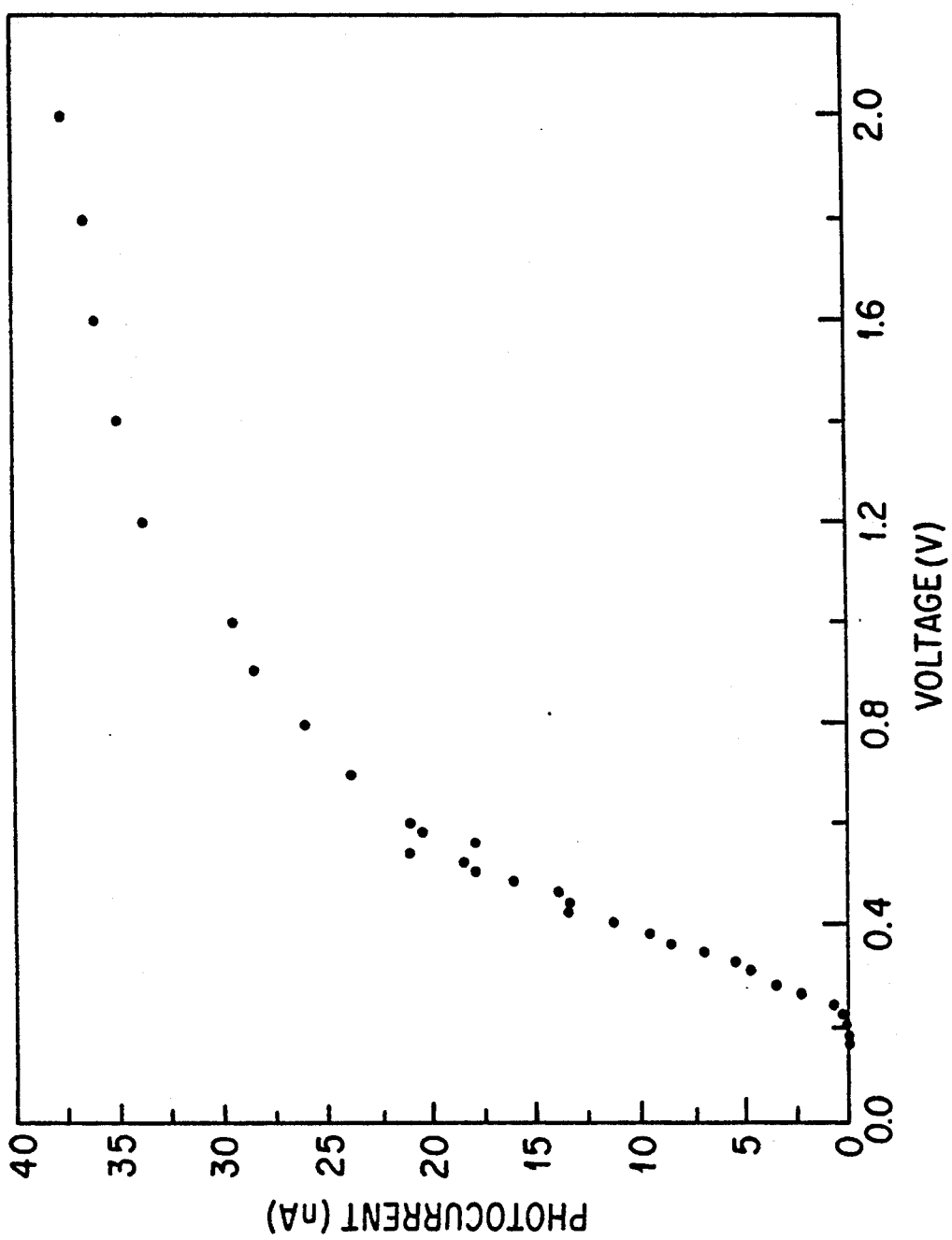
FIG. 12 Readout cathodic photocurrent spike (short circuit) as a function of bias voltage applied in previous writing step with 550 nm beam of intensity $5 \times 10^{12}$ photon·$cm^{-2} \cdot s^{-1}$ for 5 sec.

As with a capacitor, external bias has two important effects on the amount of charge stored in the thin film of the claimed invention, and also on the information recoverable in the readout signal. First, the sign of the external bias determines the sign of charge stored; that is, a positive bias results in a cathodic readout photocurrent, and a negative bias results in an anodic readout. Second, the magnitude of the applied bias influences the total amount of charge stored and thus the magnitude of the readout signal, when other factors such as light intensity and exposure time are constant. FIG. 12 shows the amplitude of the photocurrent spike as a function of applied bias in the writing step. The magnitude of the readout signal increases with bias, but tends to level out at about a $+1.2$ V bias. This suggests that the outermost portion of the thin film becomes saturated and the deeper layers begin to contribute to the charge storage. No breakdown is observed at an external bias as high as 10 V.

EXAMPLE 7

Effects of Light Intensity and Exposure Time

The photosensitivity of the instant invention is high; light intensity as weak as ca. $10^{11}$ photons·cm$^{-2}$·s$^{-1}$ is sufficient to store readable information. Further, it has been shown[4] that steady-state photocurrent under an applied bias or under short circuit conditions is a linear function of light intensity over more than 3 orders of magnitude, up to ca. $10^{15}$ photons·s$^{-1}$·cm$^{-2}$; this linearity is independent of the exciting wavelength. At higher intensities, however (white light>ca. 10 mW cm$^{-2}$), short-circuit photocurrent increases with the square root of intensity.[4]

Figure 13:
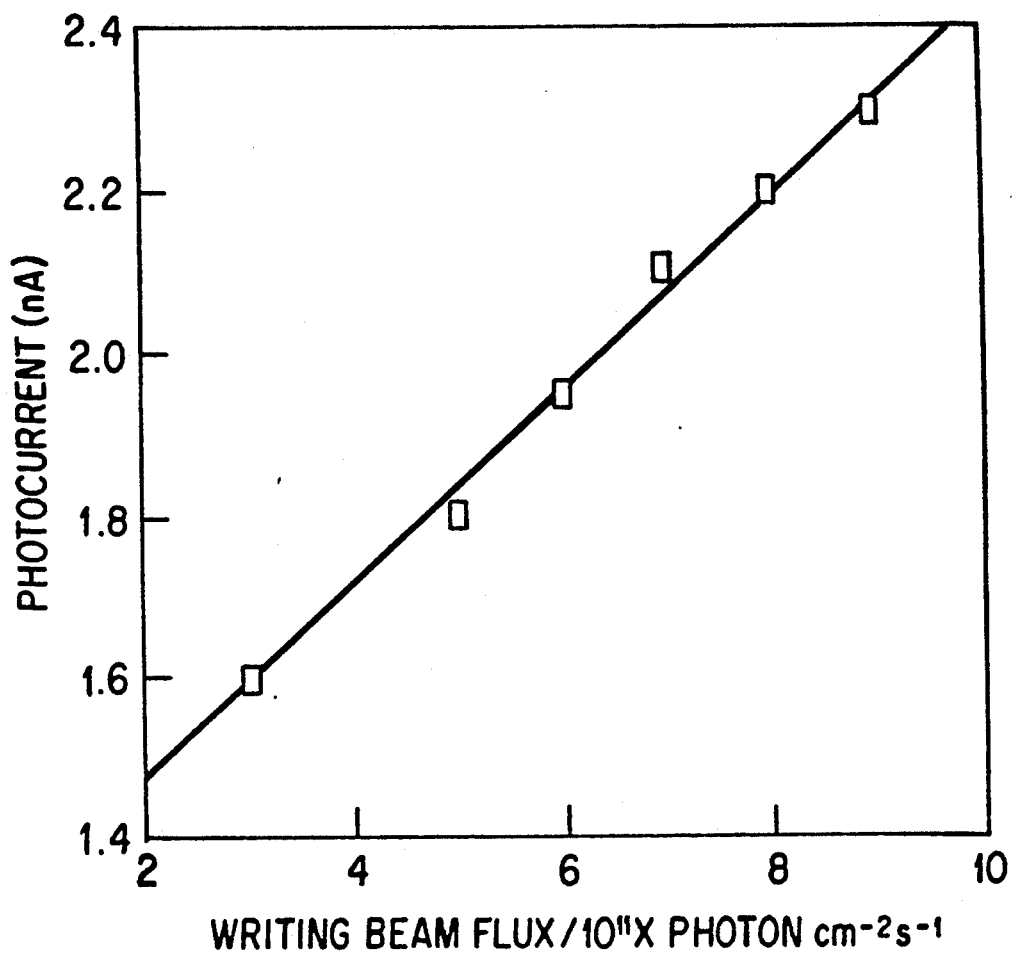
FIG. 13 Readout cathodic photocurrent spike as a function of writing beam intensity at 550 nm under a bias of +0.5 V. Readout beam (550 nm) intensity: $3 \times 10^{11}$ photon·$cm^{-2} \cdot s^{-1}$.
Figure 14:
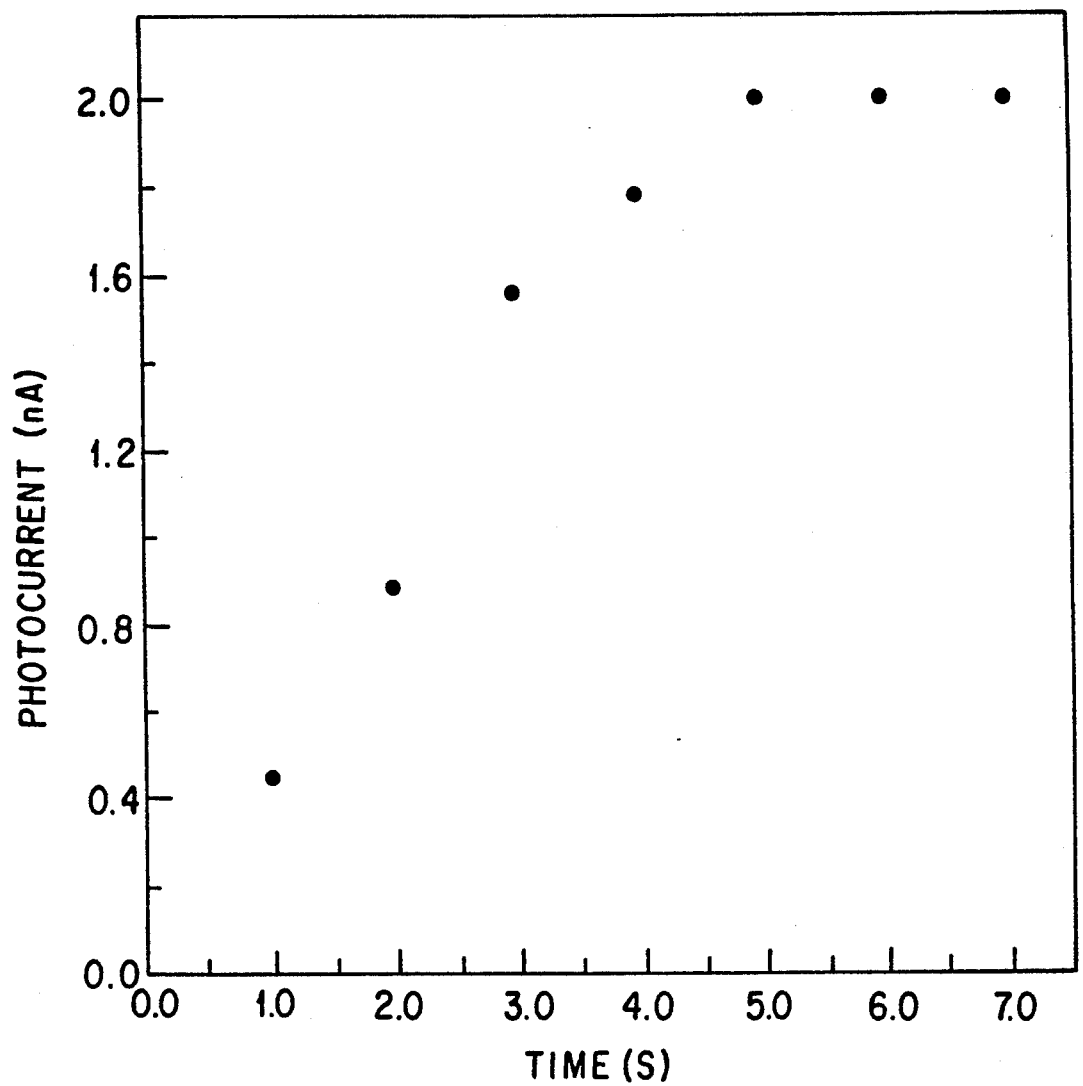
FIG. 14 Readout cathodic photocurrent spike as a function of writing beam exposure time under a bias of +0.5 V. (550 nm light beam, ca. $6 \times 10^{11}$ photon·$s^{-1} \cdot cm^{-2}$ for both writing and reading).

A linear relationship also exists between the readout transient photocurrent spike and the writing beam intensity as shown in FIG. 13. In this case, the readout beam intensity is constant and the data are written under a bias of $+0.5$ V. Under these conditions, the readout photocurrent spike as a function of pulse width of the writing beam is shown in FIG. 14. Readout signal strength increases with writing exposure time until saturation is reached after about 5 s.

REFERENCE

The citations in the following list are incorporated in pertinent part herein for the reasons cited in the text.
1. B.A. Gregg, M.A. Fox, A.J. Bard, *J. Chem. Soc., Chem. Commun.*, 1143 (1987).
2. B.A. Gregg, M.A. Fox, A.J. Bard, *J. Am. Chem. Soc.*, 111:3024-3029 (1989).
3. B.A. Gregg, M.A. Fox, A.J. Bard, *J. Phys. Chem.*, 93: 4227-4234 (1989).
4. B.A. Gregg, M.A. Fox, A.J. Bard, *J. Phys. Chem.*, 94: 1586-1598 (1990).
5. C-Y, Liu, A.J. Bard, *Chem. Phys. Lett.*, 174(2):162-166 (1990).
6. Y. Yatsuda, S. Nabetani, K. Uchida, S.-1. Minami, M. Terasawa, T. Hagiware, H. Katto, and T. Yasui, *IEEE Trans on Elec. Dev.*, ED-32(2):224-231 (1985).
7. Miura et ai., U.S. Pat. No. 4,819,210, Apr. 4, 1989.
8. Kallmann et al., U.S. Pat. No. 3,199,086, Aug. 3, 1965.
9. Mayer, U.S. Pat. No. 2,912,592, Nov. 10, 1959.
10. Oliver, U.S. Pat. No. 3,543,248, Nov. 24, 1970.
11. Van Zeghbroeck, U.S. Pat. No. 5,038,321, Aug. 6, 1991.
12. Lempicki, U.S. Pat. No. 3,059,115, Oct. 16, 1962.
13. Rosenberg et al., U.S. Pat. No. 3,643,014, Feb. 15, 1972.
14. J.R. Freeman, H.P. Kallmann, M. Silver, *Rev of Mod Phys*, 33(4):553-573 (1961).
15. A.C. Bradley, *Optical Storage for Computers*, Wiley, N.Y. (1989).
16. B. Prince, G. Due-Gundersen, *Semiconductor Memories*, Wiley, N.Y. (1983).
17. Fulenwider, U.S. Pat. No. 3,445,824, May 20, 1969.
18. Harper, U.S. Pat. No. 3,268,331, Aug. 23, 1966.
19. Kallmann et al., U.S. Pat. No. 3,005,707, Oct. 24, 1961.
20. H. Kallmann, B. Rosenberg, *Physical Review*, 97: 1596 (1955).

Changes may be made in the construction, operation and arrangement of the various parts, elements, steps and procedures described herein without departing from the concept and scope of the invention as defined in the following claims.

What is claimed is:

1. A method for storing information as a quantity of electric charge in photoconductive films, the method comprising
    irradiating a photoconductive film of single-layer composition with electromagnetic radiation, said film having conductivity less than $10^{-7}\Omega^{-1}cm^{-1}$;
    establishing an electric field substantially perpendicular to the irradiated film; and
    stopping the radiation wherein the quantity of electric charge is stored in the photoconductive film where said film was irradiated.

2. The method of claim 1 wherein the electric field is applied between two conductors substantially equidistant from each other and simultaneously in contact with the film, at least one conductor being transparent to the electromagnetic radiation.

3. The method of claim 1 wherein the electromagnetic radiation comprises visible light.

4. The method of claim 3 wherein the light has wavelength about 550 nm.

5. The method of claim 1 wherein the photoconductive film comprises (metal)(β-decoxyethyl) porphyrins.

6. The method of claim 5 wherein the metal is selected from the group Cu, Co, Ni and Pd.

7. The method of claim 1 wherein the photoconductive film is zinc-octakis (β-decoxyethyl) porphyrin.

8. The method of claim 1 wherein the photoconductive film is an aromatic compound.

9. The method of claim 1 wherein the photoconductive film is a phthalocyanine.

10. The method of claim 1 wherein the photoconductive film is an organometallic compound.

11. The method of claim 1 wherein the photoconductive film is a metal complex.

12. An apparatus for storing digital data as an electrical charge in a photoconductive film, the apparatus comprising
   a photoconductive film of single layer composition having dark conductivity less than $10^{-7}\Omega^{-1}\text{cm}^{-1}$;
   a light source to transiently irradiate a portion of the film; and
   an electric field communicating with and substantially perpendicular to the irradiated film;
wherein the electric field communicates with the film after irradiation ceases.

13. An apparatus for storing digital data as an electrical charge in a photoconductive film, the apparatus comprising
   a photoconductive film of single layer composition;
   memory elements within said film, each element being capable of storing a detectable quantity of charge, and said elements having a packing density of more than about $10^7/\text{cm}^2$;
   a light source to transiently irradiate each memory element; and
   an electric field communicating with and substantially perpendicular to each irradiated memory element;
wherein the electric field communicates with each element during and after transient irradiation of that element.

14. An apparatus for storing digital data as an electrical charge in a photoconductive film, the apparatus comprising
   a photoconductive film of single layer composition;
   an electric field communicating with and substantially perpendicular to the film; and
   a light source to transiently irradiate one side of the film while the electric field is established;
wherein the light penetrates the film from side-to-side.

15. An apparatus for storing digital data in a photoconductive film, the apparatus comprising
   a photoconductive film of single layer composition;
   memory elements within said film, each element being capable of storing a detectable quantity of charge;
   an electric field communicating with each memory element; and
   a light source to transiently irradiate each memory element while the electric field communicates with said element;
wherein memory elements can store a detectable quantity of charge in less than fifteen nanoseconds.

16. An apparatus for storing digital data in a photoconductive film, the apparatus comprising
   a photoconductive film of single layer composition;
   memory elements within said film, each element being capable of storing a detectable quantity of charge;
   an electric field communicating with each memory element; and
   a light source to transiently irradiate each memory element while the electric field communicates with said element;
wherein memory elements can store a detectable quantity of charge for more than 6000 hours at 25° C.

17. The method of claim 1 wherein the electric field is established by a scanning tunneling microscope.

18. The apparatus of claim 12, 13, 14, 15 or 16 wherein the electric field is established by a scanning tunneling microscope.

* * * * *